(12) United States Patent
Micheloni

(10) Patent No.: US 6,320,790 B1
(45) Date of Patent: Nov. 20, 2001

(54) BIASING STAGE FOR BIASING THE DRAIN TERMINAL OF A NONVOLATILE MEMORY CELL DURING THE READ PHASE

(75) Inventor: Rino Micheloni, Turate (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/586,399

(22) Filed: Jun. 2, 2000

(30) Foreign Application Priority Data

Jun. 4, 1999 (EP) .................................................. 99830348

(51) Int. Cl.[7] .................................................. G11C 16/06
(52) U.S. Cl. .................................. 365/185.2; 365/185.21
(58) Field of Search ........................... 365/185.2, 185.21, 365/185.24, 207, 208, 211, 212

(56) References Cited

U.S. PATENT DOCUMENTS

| 5,396,467 | 3/1995 | Liu et al. ........................... 365/210 |
| 5,563,826 | * 10/1996 | Pascucci ........................... 365/185.21 |
| 5,608,676 | 3/1997 | Medlock et al. ................... 365/189.09 |
| 5,835,412 | * 8/2000 | Tran .................................. 365/185.21 |
| 5,864,504 | * 1/1999 | Tanzawa ........................... 365/185.21 |
| 6,111,791 | * 8/2000 | Ghiladrelli ...................... 365/185.21 |

FOREIGN PATENT DOCUMENTS 0447277 9/1991 (EP) .

OTHER PUBLICATIONS

Otsuka, Nobuaki at al., "Circuit Techniques for 1.5–V Power Supply Flash Memory," IEEE Journal of Solid–State Circuits, US, IEEE, Inc. New York, vol. 32 No. 8, Aug. 1997, pp. 1217–1230.

* cited by examiner

Primary Examiner—A. Zarabian
(74) Attorney, Agent, or Firm—Robert Iannucci; Seed IP Law Group, PLLC

(57) ABSTRACT

The read circuit includes a biasing stage connected to the memory cell to be read and having the purpose of biasing the drain terminal of the memory cell at a preset operating potential, typically 1 V; and a regulating circuit connected to a supply line set at a supply voltage and supplying to the biasing stage a bias current which is stable as the temperature and the supply voltage vary.

16 Claims, 3 Drawing Sheets

BIASING STAGE FOR BIASING THE DRAIN TERMINAL OF A NONVOLATILE MEMORY CELL DURING THE READ PHASE

TECHNICAL FIELD

The present invention regards a biasing stage for biasing the drain terminal of a nonvolatile memory cell during the read phase.

BACKGROUND OF THE INVENTION

As is known, in a floating gate nonvolatile memory cell storage of a logic state is carried out by programming the threshold voltage of the cell itself through the definition of the quantity of electrical charge stored in the floating gate region.

According to the information stored, memory cells may be distinguished into erased memory cells (logic state stored "1"), in which no electrical charge is stored in the floating gate region, and written or programmed memory cells (logic state stored "0"), in which an electrical charge is stored in the floating gate region that is sufficient to determine a sensible increase in the threshold voltage of the memory cell itself.

It is also known that reading of a memory cell consists in converting the current absorbed by the memory cell, at a given gate-source voltage, into a voltage which is then translated to a CMOS level at output from a special comparator circuit.

In particular, to carry out reading of a memory cell, a read voltage is supplied to the gate terminal of the cell which has a value comprised between the threshold voltage of an erased memory cell and that of a written memory cell, in such a way that, if the memory cell is written, the read voltage is lower than the threshold voltage, and hence no current flows in the cell, whereas, if the memory cell is erased, the read voltage is higher than the threshold voltage, and hence current flows in the cell.

Reading of a memory cell is carried out using a read circuit known as "sense amplifier", which, in addition to recognizing the logic state stored in the memory cell, also provides for the correct biasing of the drain terminal of the memory cell. During the read phase, the drain terminal of a memory cell is in fact biased with a voltage of approximately 1 V, which is obtained as a compromise between a maximum value that is not to be exceeded in order to avoid the so-called "soft writing" phenomenon, i.e., spurious writing of the memory cell during reading of the same, and a minimum value, below which the intensity of the current flowing in the memory cell is excessively small and would require, on the one hand, the use of an extremely precise sense amplifier, and thus one more complex and costly, in order to carry out correct reading of the logic state stored in the cell, and further would usually lead to a degradation in performance in terms of reading speed.

In order to provide an example, FIG. 1 shows the output characteristics $I_{DS}=f(V_{GS})$ of a memory cell, which link the gate-source voltage $V_{GS}$ to the drain-source current $I_{DS}$ of a memory cell, for values of the voltage VD of the drain terminal of the memory cell of 1 V, 0.8 V and 0.5 V, and in which it is evident that as the voltage $V_D$ of the drain terminal of the memory cell decreases, there is a corresponding decrease in the drain-source current $I_{DS}$ flowing in the memory cell, given the same gate-source voltage $V_{GS}$.

FIG. 2 shows one of the classic circuit diagrams of a sense amplifier, in which, for reasons of simplicity, the column decoding, which enables a single column of the memory array to be selected at a time, has been omitted.

According to what is illustrated in the above-mentioned figure, the sense amplifier, indicated as a whole by 1, comprises a supply line 2 set at a supply voltage $V_{CC}$ (for example, between 2.5 and 3.8 V), a ground line 3 set at the ground voltage $V_{GND}$ (for example, 0 V), an array branch 4 connected, via an array bit line 5, to an array cell 6, the content of which is to be read, and a reference branch 8 connected, via a reference bit line 10, to a reference cell 11, the content of which is known.

In particular, the array cell 6 and the reference cell 11 have gate terminals receiving the same read signal $V_{READ}$, drain terminals connected to the array bit line 5 and, respectively, to the reference bit line 10, and source terminals connected to the ground line 3.

The array branch 4 comprises an array biasing stage 12 for biasing the drain terminal of the array cell 6, comprising a fedback cascode structure formed of an NMOS transistor 14 and a NOR logic gate 20. In particular, the NMOS transistor 14 has a source terminal connected to the array bit line 5, a drain terminal connected, via a diode-connected PMOS transistor 16, to the supply line 2, and a gate terminal connected to an output terminal of the NOR logic gate 20, which in turn has a first input terminal receiving a control signal ENS and a second terminal connected to the source terminal of the NMOS transistor 14.

The control signal ENS is a logic signal, the low logic level of which enables operation of the sense amplifier 1, whilst its high logic level disables operation of the sense amplifier 1.

The reference branch 8 comprises a reference biasing stage 21 for biasing the drain terminal of the reference cell 11, comprising an NMOS transistor 22 having a source terminal connected to the reference bit line 10, a drain terminal connected, via a PMOS transistor 24, to the supply line 2, and a gate terminal connected to an output terminal of a NOR logic gate 26, which has a first input terminal receiving the control signal ENS and a second terminal connected to the source terminal of the NMOS transistor 22.

The PMOS transistors 16, 24 form a current mirror 28 carrying out the aforementioned current-to-voltage conversion, and in particular have gate terminals connected together and to the drain terminal of the PMOS transistor 16, source terminals connected to the supply line 2, and drain terminals connected to the drain terminals of the NMOS transistor 14 and, respectively, of the NMOS transistor 22 and defining an array node 30 and a reference node 32, respectively.

Finally, the sense amplifier 1 comprises a comparator 34 having a non-inverting input terminal connected to the array node 30, an inverting input terminal connected to the reference node 32, and an output terminal on which a logic signal is supplied that is indicative of the logic state stored in the array cell 6.

Connected to the array bit line 5 are moreover a number of array cells 6 arranged on the same array column, the capacitances of which are represented schematically in FIG. 1 by a equivalent array capacitor 36.

As shown in greater detail in FIG. 3, each NOR gate 20, 26 comprises an inverter 40 formed of a pull down NMOS transistor 42 and a pull up PMOS transistor 44 having gate terminals connected together and to the source terminals of the NMOS transistors 14 and 22, respectively, and drain terminals connected together and to the gate terminals of the NMOS transistors 14 and 22, respectively. The NMOS transistor 42 further has a source terminal connected to ground, whilst the PMOS transistor 44 has a source terminal connected to a drain terminal of a PMOS transistor 46 having a source terminal connected to the supply line 2 and a gate terminal receiving the control signal ENS.

Finally, each NOR logic gate 20, 26 comprises an NMOS transistor 48 having a gate terminal receiving the control signal ENS, a source terminal connected to ground, and the drain terminal connected to the drain terminals of the NMOS transistor 42 and the PMOS transistor 44.

The NOR logic gate 20 drives in feedback the NMOS transistor 14, which operates in cascode configuration, performing the following three different functions.

The first function performed by the NMOS transistor 14 is that of decoupling the array node 30 from the array bit line 5, and this has positive effects on the reading speed. In fact, the capacitance of the equivalent array capacitor 36 depends upon the parameters of the technological process and upon the type of architecture of the memory array, and, in any case, it is of several pF as compared to the tens of fF of the array node 30. Thanks to the cascode effect, the variation in the voltage present on the array node 36 and produced by the current $I_{MAT}$ flowing in the array bit line 5 is higher than that present across the equivalent array capacitor 30 and produced by the same current, and since the voltage present between the array node 30 and the reference node 32 constitutes the input voltage of the comparator 34, it may be readily understood how this aspect is particularly important for the reading speed.

The second function performed by the NMOS transistor 14 is that of preventing the PMOS transistor 16 from altering the biasing of the array bit line 5. This effect is obtained thanks to the high output impedance of the NMOS transistor 14 due to the cascode effect.

Finally, the third function performed by the NMOS transistor 14 is that of preventing the soft writing phenomenon. In fact, as soon as the array bit line 5 exceeds the logic threshold of the NOR logic gate 20, the latter reduces the voltage of the gate terminal of the NMOS transistor 14, thus interrupting the conductive path through which the array bit line 5 itself is charged and preventing the drain terminal of the array cell 6 from exceeding the logic threshold of the NOR logic gate 20.

The presence of a NOR logic gate 20 instead of a simple inverter is justified by the possibility of turning off the sense amplifier 1 whenever required (during programming, during stand by, etc.), the latter being on when the control signal ENS supplied to the input terminals of the NOR logic gates 20, 26 goes low.

In particular, the soft writing problem especially affects the reference cells 11 used for reading, in that these are biased whenever any memory location is to be read. It should be borne in mind that, typically, raising the voltage of the drain terminal of a memory cell by 100 mV above 1 V means decreasing the service life of the memory device by one order of magnitude; i.e., in other words, it means that, in the event of the shifting of the thresholds of the reference cells 11, the memory device may malfunction after one year of activity instead of after ten years.

The requisites, in terms of reliability of reading the contents of memory cells and, consequently, in terms of precise biasing of the drain terminals of the memory cells to be read, have become increasingly stringent ever since technological processes imposed a reduction in the gain of memory cells and ever since multilevel nonvolatile memories, i.e., ones formed of memory cells able to store more than one bit each, began appearing on the market.

The introduction of this type of memories has, in fact, revealed more clearly the intrinsic limits of known sense amplifiers, by means of which it is altogether impossible to meet the requirements for correct biasing of the drain terminal.

As is known, in fact, programming of memory cells is affected by uncertainty, and the memory cells in which the same item of information is stored do not all present the same threshold voltage but, in practice, to each item of information to be stored is associated a respective distribution of the values of the respective threshold voltage, these values being comprised between a minimum value and a maximum value set apart from the maximum value of the previous distribution and/or from the minimum value of the subsequent distribution in a way sufficient for enabling correct reading of the cells, the reading consisting in converting the current flowing in the memory cell to be read into a voltage, which is then compared with different voltage values intermediate between the threshold distributions referred to above.

FIGS. 4 and 5 show examples of the distributions of the threshold voltages $V_t$ associated, respectively, to a two level conventional memory cell, i.e., a memory cell in which only one bit is stored, and a four level memory cell, i.e., a memory cell in which two bits are stored. For each distribution, the maximum and minimum values typical of the threshold voltages $V_t$ and the binary information associated thereto are moreover indicated on a non uniform scale. Of course, other threshold voltages can be used and many more bits than two stored in some memory cells.

From a simple analysis of the above figures, it is immediately evident that, within the same range of threshold voltages, the use of multilevel memory cells means having four distributions instead of two, and that thus the use of multilevel memory cells involves a reduction in the distance between two adjacent distributions, to which there corresponds a reduction in the difference between the currents that flow in the memory cells themselves and that correspond to adjacent levels. Typically, between two adjacent distributions, the corresponding difference between the currents flowing in the memory cells is in the region 20 $\mu$A.

Consequently, in the case of use of memory cells with two bits per cell, the sense amplifier 1 has to work with as many as four distributions, and no longer two as in the case of conventional memory cells, and consequently the reliability requisites become more stringent, in that the distributions are closer together and the current used to carry out reading is lower.

It is therefore evident how the correct and precise biasing of the drain terminal of the memory cell 6 during the read phase is extremely important.

The sense amplifier 1 illustrated in FIG. 1 does not guarantee, however, precision in the biasing of the drain terminals of the memory cells to be read that is sufficient for meeting the reliability requisites imposed by the advent of multilevel memory cells.

In fact, typically, with the present fabrication processes, the threshold voltage of the memory cell is between 700 and 800 mV, and since the logic threshold of the NOR logic gate 20 must be 1 V, the NOR logic gate 20 itself is sized using a PMOS transistor 44 having a mainly resistive behavior and an NMOS transistor 42 having a mainly conductive behavior. In this way, the logic threshold of the NOR logic gate 20 is close to that of the NMOS transistor 42; i.e., in other words, the NOR logic gate 20 is unbalanced in favor of the NMOS transistor 42.

In actual fact, the NOR logic gate 20 goes into action only when the NMOS transistor 42 is on and its own logic threshold is higher than that of the NMOS transistor 42. Basically, the voltage of the drain terminal of the array cell 6 to be read is substantially equal to the threshold voltage of the NMOS transistor 42 increased by a quantity necessary for operating the NOR logic gate 20 itself.

A large number of the devices currently available on the market implement the solution described above to obtain the 1 V voltage on the drain terminal of the memory cell to be read.

A regulation based on the use of an NMOS transistor 14 operating as cascode and a NOR logic gate 20 markedly unbalanced is, however, affected to a considerable extent by variations in the supply voltage and in the temperature, which at present range, respectively, between 2.5 and 3.8 V and −40 and +120° C.

FIG. 6 shows the pattern of the voltage $V_D$ of the drain terminal of an array cell 6 to be read, in which the binary information "00" is stored, as a function of the supply voltage $V_{CC}$ and for temperature values of 40°C., 27° C. and 90° C. As may be noted, the voltage $V_D$ increases, given the same temperature T, as the supply voltage $V_{CC}$ increases, and, given the same supply voltage $V_{CC}$, as the temperature T decreases.

The effect of the variation in the supply voltage $V_{CC}$ on the markedly unbalanced NOR logic gate 20 may be explained as follows: assuming that we are working with supply voltages $V_{CC}$ of 2.5 V and we set the voltage $V_D$ exactly at 1 V, the PMOS transistor 44 and NMOS transistor 42 are sized so that, as has been said above, the NOR logic gate 20 is unbalanced in favor of the NMOS transistor 42. However, when the supply voltage $V_{CC}$ increases to 3.8 V, the gate-source voltage of the PMOS transistor 44 increases by 1.3 V, whilst the gate-source voltage of the NMOS transistor 42 increases by a few tens of mV, as may be deduced from an analysis of FIG. 6. It is as if, on account of the increase in the supply voltage $V_{CC}$, the "force" of the PMOS transistor 44 were increased, and it is for this reason that the unbalanced NOR gate 20 tends to draw the drain terminal of the array cell 6 towards higher voltages as the supply voltage $V_{CC}$ increases. Similar considerations may be made as regards the effect of the variation in temperature on the unbalanced NOR logic gate 26.

Since at present the supply voltage $V_{CC}$ and the temperature T range, respectively, between 2.5 and 3.8 V and between −40 and +120° C., and since the voltage $V_D$ of the drain terminal of the array cell 6 to be read must not under any circumstances exceed 1 V, it is necessary to size the sense amplifier 1 so as to have the voltage $V_D$ of 1 V in the worst operating case, i.e., with a supply voltage of 3.8 V and an operating temperature of −40 ° C.

In this way, however, when the supply voltage $V_{CC}$ is 2.5 V and the temperature T is 120° C., the drain terminal of the array cell 6 to be read is set at a voltage $V_D$ well below 1 V, namely 0.7 V, with a variation of as much as 300 V. In general, this entails, in conventional memory cells, a degradation in performance in terms of reading speed, and, in multilevel memory cells, even the impairment of the functioning of the entire memory device.

SUMMARY OF THE INVENTION

According to principles of the present invention a biasing stage is provided for biasing the drain terminal of a non-volatile memory cell during the read phase that enables, in a simple and economic way, precise biasing of the drain terminal to a selected voltage independently of variations in the supply voltage and of the operating temperature.

BRIEF DESCRIPTION OF THE DRAWINGS

For a better understanding of the present invention, a preferred embodiment thereof will now be described, simply to provide a non-limiting example, with reference to the attached drawings, in which.

DETAILED DESCRIPTION OF THE INVENTION

The present invention is based on the principle of limiting the gate-source voltage variation of the PMOS transistor 44 caused by the variations in the supply voltage $V_{CC}$ and in the temperature, by using a generator of current that remains stable as the voltage and temperature vary to control the current flowing in the PMOS transistor 44 and NMOS transistor 42 of the inverter 40 of the NOR logic gate 20.

Figure 1:
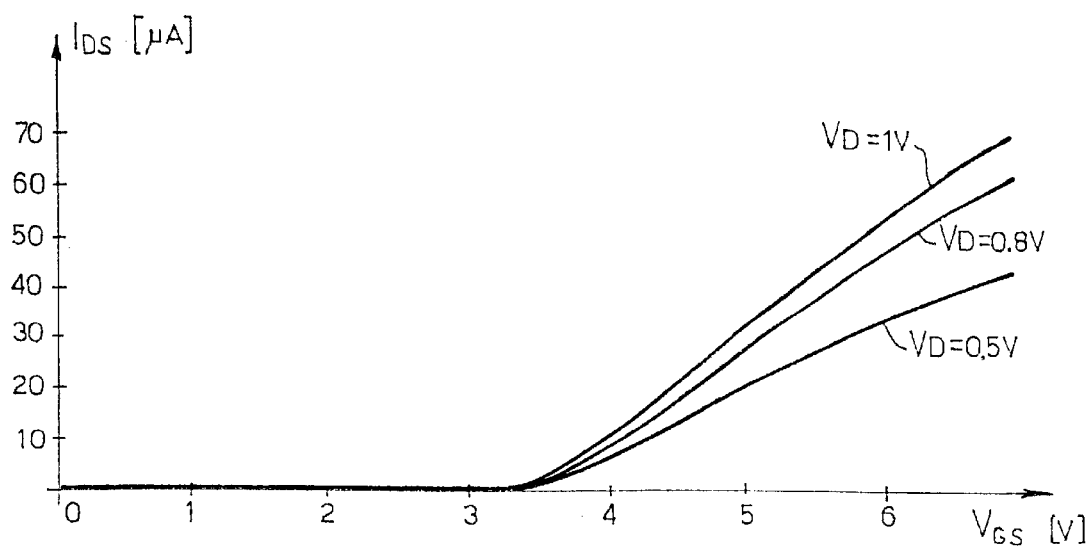
FIG. 1 shows the output characteristic $I_{DS}=f(V_{GS})$ of a memory cell as the drain volts $V_D$ of the memory cell varies.
Figure 4:
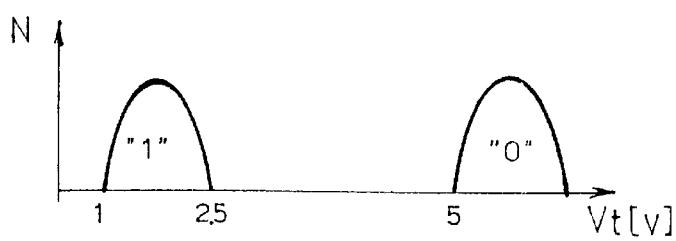
FIG. 4 shows one example of the distributions of the threshold voltages of memory cells containing only one bit per cell.
Figure 5:
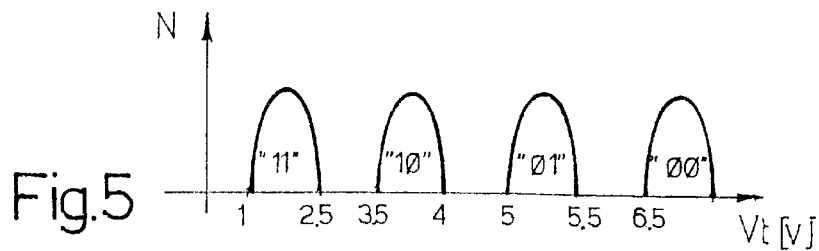
FIG. 5 shows one example of the distribution of the threshold voltages of memory cells containing two bits per cell.
Figure 6:
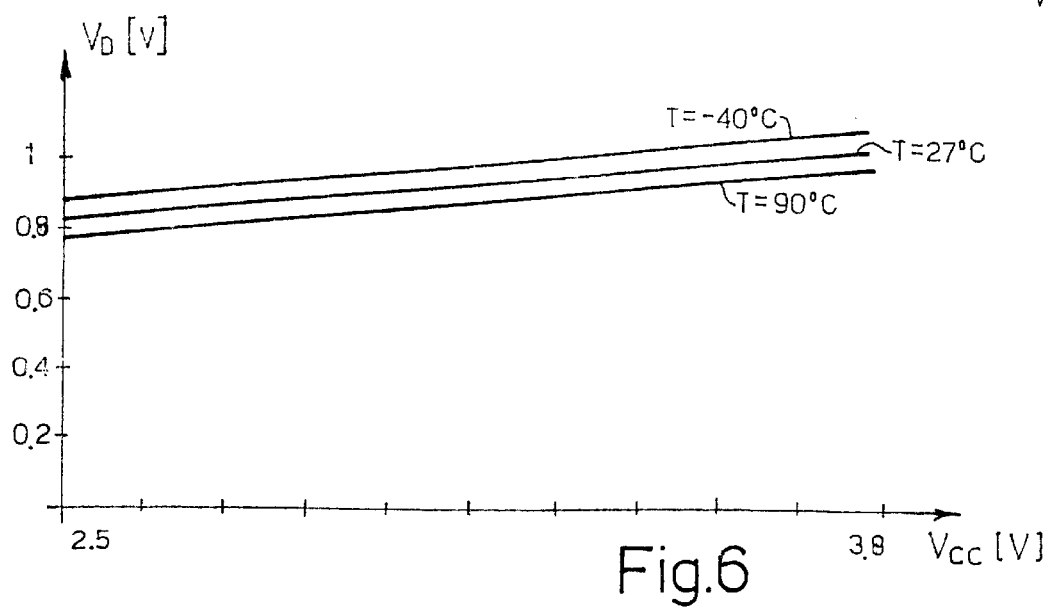
FIG. 6 shows the pattern of the voltage of the drain terminal of a memory cell as the supply voltage varies and for different temperature values.
Figure 2:
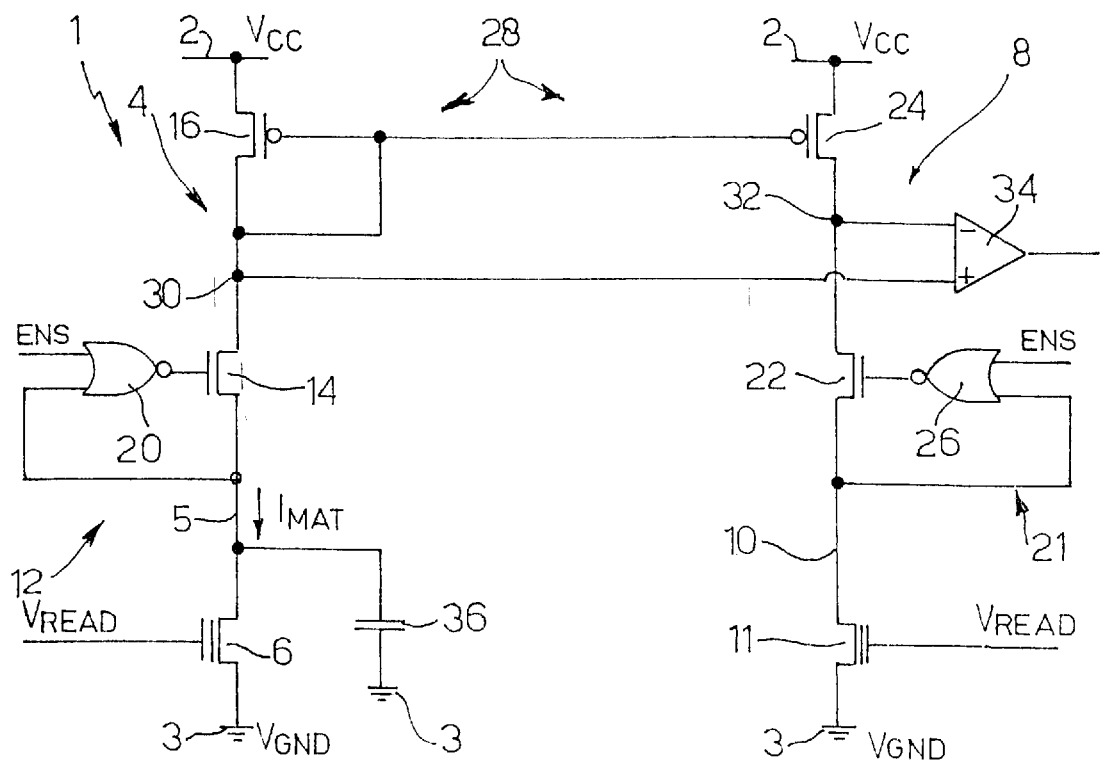
FIG. 2 shows one of the classic prior art circuit diagrams of a sense amplifier.
Figure 7:
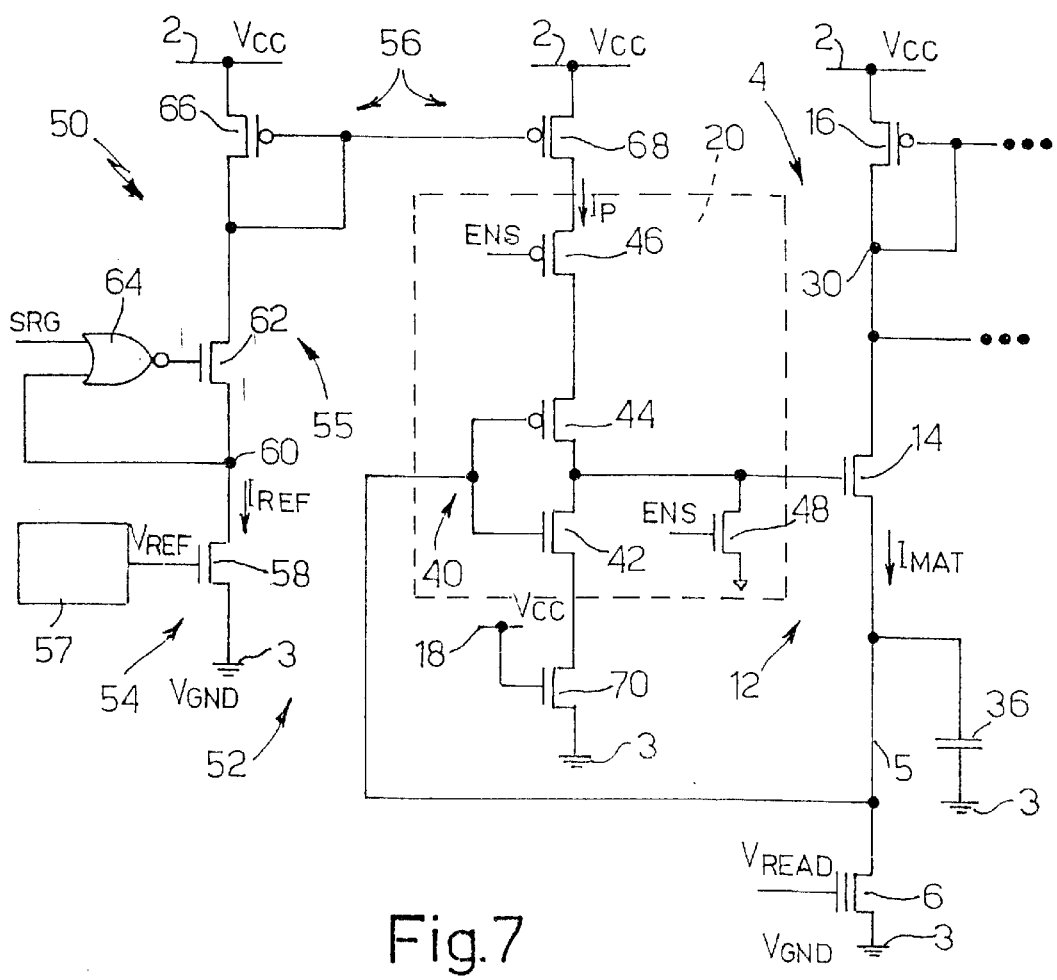
FIG. 7 shows the circuit diagram of the array branch of a sense amplifier made according to the present invention.

In FIG. 7, a sense amplifier made according to the present invention is indicated, as a whole, by 50; in this sense amplifier, parts that are identical to those of the sense amplifier 1 of FIG. 1 are identified by the same reference numbers, and, for reasons of simplicity of illustration, only the array branch is shown.

In addition to what has been described with reference to the sense amplifier 1 illustrated in FIG. 1, the sense amplifier 50 comprises a current regulating circuit 52 connected between the supply line 2 and the ground line 3 and supplying to the NOR logic gate 20 a bias current $I_p$ that is stable as the voltage and temperature vary.

In particular, the current regulating circuit 52 comprises a current generator stage 54 supplying at an output a reference current $I_{REF}$ that is stable as the voltage and temperature vary, a stabilizer stage 55 connected to the output of the current generator stage 54 for limiting the residual variations in the reference current $I_{REF}$, and a current mirror 56 interposed between the stabilizer stage 55 and the NOR logic gate 20 and supplying to the NOR logic gate 20 the bias current $I_p$.

The current generator stage 54 comprises a voltage generator 57 supplying at an output a reference voltage $V_{REF}$, and an NMOS transistor 58 having a gate terminal receiving the reference voltage $V_{REF}$, a source terminal connected to ground, and a drain terminal connected to a node 60 which defines the output of the current generator stage 54 and on which it supplies the reference current $I_{REF}$.

The NMOS transistor 58 is sized with a channel length and width well above the minimum ones allowed by technology, so as to cut dimensional variations down to the minimum, thus favoring reproducibility from one memory device to another. The NMOS transistor 58 is moreover sized so that it is in a saturation condition during operation of the current regulating circuit 52.

The voltage generator 57 supplies at an output a reference voltage $V_{REF}$ that is stable as the voltage and temperature vary and may, for example, be made using a band gap voltage generator, if the latter is already directly available in the device in which the sense amplifier 20 is used.

The stabilizer stage 55 has the purpose of limiting the variations in the reference current $I_{REF}$ supplied by the current generator 54 via the regulation of the voltage of the drain terminal of the NMOS transistor 58, and comprises a feedback cascode structure formed of an NMOS transistor 62 in cascode configuration and a NOR logic gate 64.

In particular, the NMOS transistor 62 has a source terminal connected to the node 60, a drain terminal connected to the supply line 2 through one of the two PMOS transistors 66, 68, in particular the one that is diode-connected, that form the current mirror 56, and a gate terminal connected to an output terminal of the NOR logic gate 64, which in turn has a first input terminal receiving a control signal SRG and a second input terminal connected to the node 60.

In detail, the PMOS transistors 66, 68 have gate terminals connected together and to the drain terminal of the PMOS transistor 66, source terminals connected to the supply line 2, and drain terminals connected, respectively, to the drain terminal of the NMOS transistor 62 and to the drain terminal of the PMOS transistor 46 of the inverter 40 of the NOR logic gate 20.

On the drain terminal of the PMOS transistor 68 there is present the bias current $I_P$, which is stable as the voltage and temperature vary and is equal to the reference current $I_{REF}$ supplied by the NMOS transistor 58 multiplied by the mirror factor of the current mirror 56.

Figure 3:
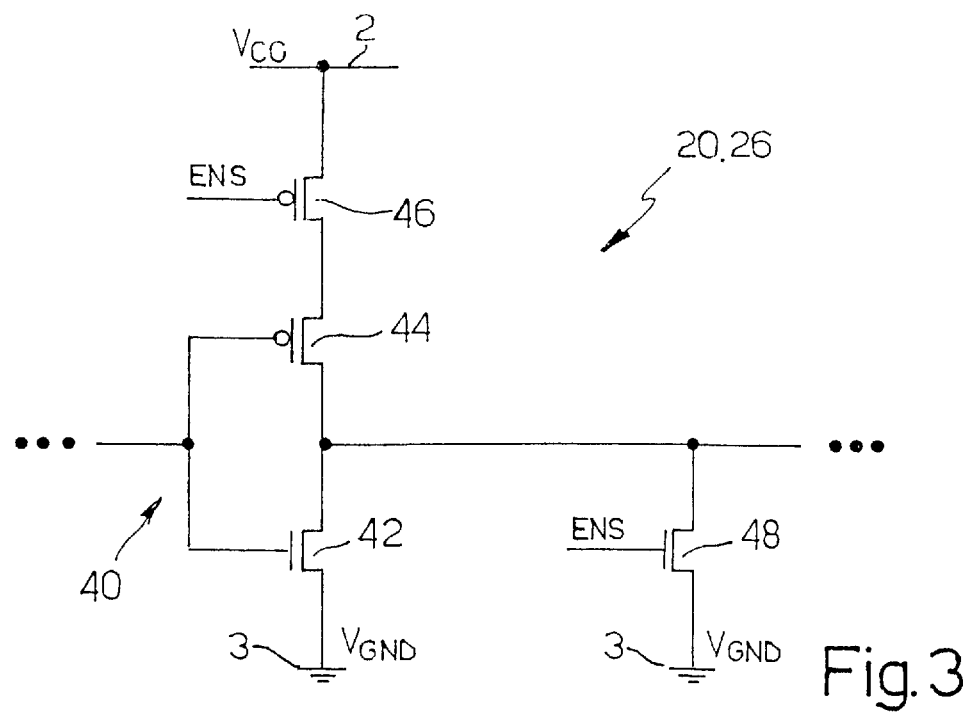
FIG. 3 shows a known circuit diagram of a NOR logic gate.

The NOR logic gate 64 has a circuit structure of the type shown in FIG. 3 and is sized with the NMOS transistor conductive and with the PMOS transistor particularly resistive so as to reduce to the minimum the voltage variations of the drain terminal of the NMOS transistor 58 caused by the variations in the supply voltage $V_{CC}$ and in the temperature. In any case, these variations have minimal repercussions on the current flowing in the NMOS transistor 58, in that the latter, as was said previously, is operating in conditions of saturation.

The control signal SRG is a logic signal in which the low logic level enables operation of the regulating circuit 52, whilst the high logic level disables operation of the regulating circuit 52.

Finally, the current regulating circuit 52 comprises an NMOS transistor 70 arranged between the NOR logic gate 20 and the ground line 3 and having the gate terminal connected to the supply line 2, the source terminal connected to the ground line 3, and the drain terminal connected to the source terminal of the NMOS transistor 42 of the inverter 40 of the NOR logic gate 20.

The use of two distinct control signals, ENS and SRG, for controlling the NOR logic gates 20 and 64 derives from the wish to meet various types of specifications. In particular, in the case where the consumption of the sense amplifier 50 is to be reduced, the two control signals ENS and SRG are identical and enable, when they assume a high logic state, simultaneous switching off of the sense amplifier 50 and of the current regulating circuit 52, whereas in the case in which a higher consumption may be allowed, the control signal SRG is distinct from the control signal ENS, so that operation of the current regulating circuit 52 may be enabled, and operation of the sense amplifier 50 may be disabled.

It is moreover emphasized that the current regulating circuit 52 does not have to be repeated entirely for each sense amplifier 50, but the part formed of the NMOS transistors 58, 62, the PMOS transistor 66, the NOR logic gate 64, and the voltage generator 57 may be common to a number of sense amplifiers 50, with consequent reduction in consumption and in the area occupied on the silicon.

The operation of the sense amplifier 50 is evident from what has been described above. In particular, it is emphasized that the current generating circuit 54 supplies at the output a current that is stable as the supply voltage $V_{CC}$ and the temperature vary, and the residual variations of which are further limited by the structure formed of the NMOS transistor 62 in fedback cascode configuration. The current mirror 56 performs solely the function of mirroring the current supplied by the current generator 54, so as to limit the current flowing in the inverter 40.

The limitation in the current variations that is obtained with the stabilizer circuit 55 considerably reduces the dragging effect that the supply voltage has on the voltage of the drain terminal of the array cell 6. In fact, with a variation in the supply voltage $V_{CC}$ from 2.5 V to 3.8 V, with the present invention there is a variation in the voltage of the drain terminal of the array cell 6 of a few tens of mV.

To eliminate this dependence altogether and, indeed, to invert it, an NMOS transistor 70 has been added, the gate terminal of which is set at the supply voltage $V_{CC}$. With a connection of this sort, as the supply voltage $V_{CC}$ increases, the conductivity of the NMOS transistor 70 increases accordingly, and hence also the "force" of the NMOS transistor 42, since the transistors 42 and 70 are connected in series.

In other words, according to the present invention, regulation of the current flowing in the inverter 40 is carried out not only on the PMOS transistor 44 side, but also on the NMOS transistor 42 side.

Figure 8:
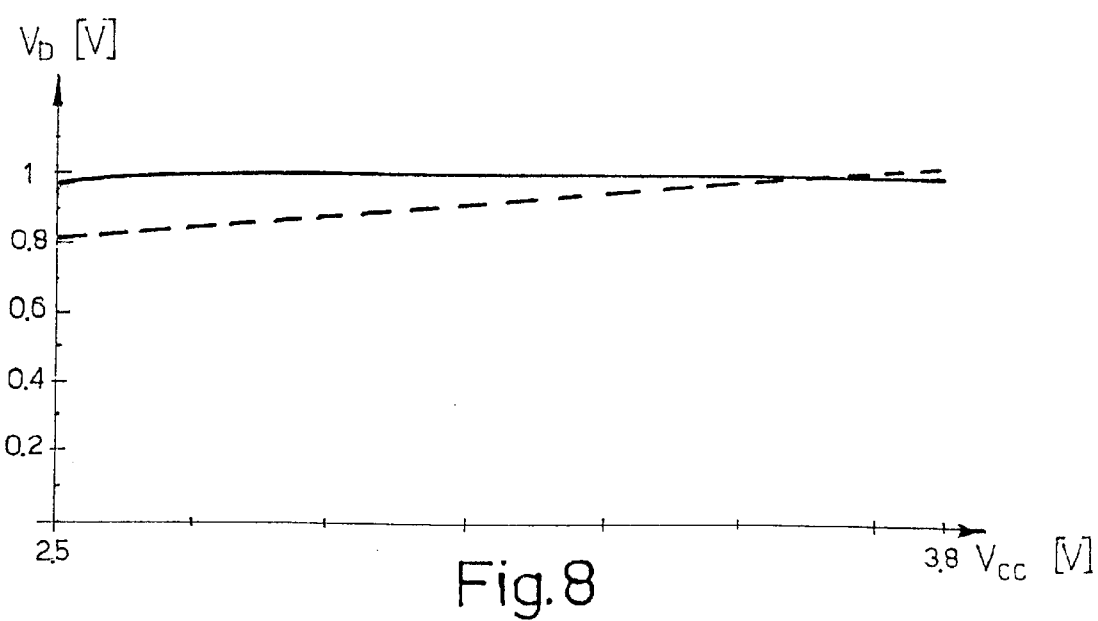
FIG. 8 shows the pattern of the voltage of the drain terminal of a memory cell as the supply voltage that is obtained using the sense amplifier according to the present invention varies.

FIG. 8 shows the simulated pattern of the voltage $V_D$ of the drain terminal of the memory cell 6 as a function of the supply voltage $V_{CC}$ for a temperature of the array cell 6 of 27° C., both in the case where a sense amplifier according to the known art is used (dashed line) and in the case where a sense amplifier according to the present invention is used (solid line).

As may be noted in this figure, in contrast with the known art where the voltage $V_D$ increases as the supply voltage $V_{CC}$ increases, with the present invention there is obtained a substantial flattening of the curve; i.e., it is possible to render the voltage $V_D$ substantially constant as the supply voltage $V_{CC}$ varies. In particular, with the present invention it is even possible to invert the relation of direct proportionality that links the voltage $V_D$ to the supply voltage $V_{CC}$, bringing about a slight decrease of the voltage $V_D$ as the supply voltage $V_{CC}$ increases.

Furthermore, the patterns of the voltage $V_D$ of the drain terminal of the memory cell 6 as a function of the supply voltage $V_{CC}$ for other values of the temperature of the array cell 6 are not given in FIG. 8 in that they basically coincide with the pattern corresponding to a temperature of 27° C. and are not visually distinguishable from it.

The advantages that the sense amplifier according to the present invention makes possible emerge clearly from what has been described above.

In particular, it is emphasized that not only is it possible by means of the sense amplifier 50 to render the voltage of the drain terminal of the memory cell to be read constant as the supply voltage and the operating temperature vary, but also this advantage is obtained via a particularly simple circuit structure, a large part of which does not have to be repeated for each sense amplifier, but may be common to more than one sense amplifier.

The latter aspect is particularly important from the standpoints of consumption and of the area occupied on the silicon, in that in parallel access memories the number of sense amplifiers required is equal to the number of memory cells that are read in parallel; this number, in commercially available memories, may be 8, 16 or 32, whilst in memories with burst type reading it may be as high as 64.

Finally, it is clear that modifications and variations may be made to the sense amplifier described and illustrated herein, without thereby departing from the scope of protection of the present invention.

For example, a current regulating circuit 52 of the type previously described may also be used for regulating the voltage of the drain terminal of the reference cell 11.

What is claimed is:

1. A read circuit for a nonvolatile memory comprising:
   a memory cell;
   a first reference line set at a first reference potential;
   a biasing stage connected to said memory cell for biasing a first terminal of the memory cell at a preset operating potential; and
   a regulating circuit connected to said first reference line for supplying to said biasing stage a bias current which is stable as the temperature and as said first reference potential vary.

2. The read circuit according to claim 1, wherein said regulating circuit comprises a current generating circuit supplying on a output a reference current which is stable as the temperature and as said first reference potential vary.

3. The read circuit according to claim 2, wherein said regulating circuit further comprises:
   a stabilizing circuit arranged between said current generating circuit for said biasing stage for limiting the residual variations of said reference current caused by variations of said first potential and said temperature.

4. The read circuit according to claim 3, wherein said regulating circuit further comprises:
   a current mirror arranged between said stabilizing circuit and said biasing stage.

5. The read circuit according to claim 1, wherein said regulating circuit further comprises:
   a first transistor arranged between said biasing stage and a second reference line set at a second reference potential lower than said first reference potential and having a first terminal connected to said biasing stage, a second terminal connected to said second reference line, and a control terminal connected to said first reference line.

6. The read circuit according to claim 1, wherein said biasing stage comprises a first feedback cascode structure.

7. The read circuit according to claim 6, wherein said first fedback cascode structure comprises a second transistor having a first terminal connected to said first reference line, a second terminal connected to said first terminal of said memory cell, and a control terminal, and first feedback circuit receiving said bias current and having an input terminal connected to said second terminal of said second transistor and an output terminal connected to said control terminal of said second transistor.

8. The read circuit according to claim 7, wherein said first feedback circuit comprise first logic gate circuit.

9. The read circuit according to claim 2, wherein said current generating circuit comprise a third transistor having a first terminal supplying said reference current, a second terminal connected to a second reference line set at a second reference potential lower than said first reference potential, and a control terminal receiving a third reference potential which is substantially stable as the temperature and as said first reference potential vary.

10. The read circuit according to claim 9, wherein said third transistor is sized with a channel length and width greater than the minimum ones allowed by the technology used for the fabrication of said memory cell.

11. The read circuit according to claim 9, wherein said current generating circuit further comprise voltage generating circuit supplying said third reference potential.

12. The read circuit according to claim 11, wherein said voltage generating circuit comprise a band gap voltage generator.

13. The read circuit according to claim 3, wherein said stabilizing circuit comprise a second fedback cascode structure.

14. The read circuit according to claim 13, wherein said second fedback cascode structure comprises a fourth transistor having a first terminal connected to said first reference line, a second terminal connected to said output of said current generating circuit, and a control terminal, and second feedback circuit having an input terminal connected to said second terminal of said fourth transistor and an output terminal connected to said control terminal of said fourth transistor.

15. The read circuit according to claim 14, wherein said second feedback circuit comprise second logic gate circuit.

16. A read circuit for a nonvolatile memory comprising:
    a memory cell;
    a first reference line set at a first reference potential;
    a biasing stage connected to said memory cell for biasing a first terminal of the memory cell at a preset operating potential; and
    a current generating circuit connected to said first reference line for supplying to said biasing stage a reference current which is stable as the temperature and as said first reference potential vary: and
    a stabilizing circuit arranged between said current generating circuit and said biasing stage for limiting the residual variations of said reference current caused by variations of said first reference potential and said temperature.

* * * * *